US012242728B2

(12) United States Patent
Chen (10) Patent No.: US 12,242,728 B2
(45) Date of Patent: Mar. 4, 2025

(54) GENERATING COMMANDS FOR A MEMORY CONTROLLER TO WRITE A TARGET VALUE

(71) Applicant: REALTEK SEMICONDUCTOR CORPORATION, Hsinchu (TW)

(72) Inventor: Yue-Feng Chen, Suzhou (CN)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 92 days.

(21) Appl. No.: 17/902,026

(22) Filed: Sep. 2, 2022

(65) Prior Publication Data
US 2023/0072176 A1 Mar. 9, 2023

(30) Foreign Application Priority Data

Sep. 9, 2021 (CN) .......................... 202111056703.2

(51) Int. Cl.
*G06F 3/06* (2006.01)
*G06F 12/02* (2006.01)
*G11C 7/20* (2006.01)

(52) U.S. Cl.
CPC .......... *G06F 3/0613* (2013.01); *G06F 3/0659* (2013.01); *G06F 3/0673* (2013.01); *G06F 12/0223* (2013.01); *G11C 7/20* (2013.01)

(58) Field of Classification Search
CPC .... G06F 3/0613; G06F 3/0659; G06F 3/0673; G06F 12/0292; G06F 12/0223; G06F 12/0879; G06F 2212/1024; G06F 2212/1028; G06F 2212/657; G06F 12/109; G06F 3/0632; G06F 13/1668;
(Continued)

(56) References Cited

U.S. PATENT DOCUMENTS 5,559,980 A * 9/1996 Connors .............. G06F 12/023
714/38.11
10,642,616 B2 5/2020 Dehon
(Continued)

OTHER PUBLICATIONS

"The Authoritative Dictionary of IEEE Standards Terms, Seventh Edition," in IEEE Std 100-2000, pp. 1-2, 128, Dec. 11, 2000. (Year: 2000).*

(Continued)

*Primary Examiner* — Kenneth M Lo
*Assistant Examiner* — Hewy H Li
(74) *Attorney, Agent, or Firm* — WPAT, PC (57) ABSTRACT

An electronic device capable of accessing a memory and a data writing method are provided. The electronic device includes a processing unit, a bus, and a memory controller. The processing unit includes a bus interface control circuit, and the processing unit generates a first write command through the bus interface control circuit according to a memory access command. The memory access command contains a first memory address and a target value, and the first write command contains the first memory address and the target value. The bus is coupled to the bus interface control circuit and configured to generate a second write command according to the first write command. The second write command contains a second memory address and the target value. The memory controller is coupled to the bus and configured to write the target value into the memory according to the second memory address.

7 Claims, 10 Drawing Sheets

(58) Field of Classification Search
CPC ........ G06F 9/4403; G06F 13/16; G06F 13/28; G06F 13/20; G06F 13/14; G06F 13/24; G06F 13/26; Y02D 10/00; G11C 11/4072; G11C 7/20
See application file for complete search history.

(56) References Cited

U.S. PATENT DOCUMENTS

| | | | |
|---|---|---|---|
| 10,698,684 B2 | 6/2020 | Beckett | |
| 10,747,511 B2 | 8/2020 | Radigan | |
| 2004/0030861 A1* | 2/2004 | Plackle | G06F 15/7867 |
| | | | 712/32 |
| 2005/0108469 A1* | 5/2005 | Freeman | G06F 13/16 |
| | | | 711/105 |
| 2006/0129767 A1 | 6/2006 | Berenyi | |
| 2009/0089515 A1* | 4/2009 | Michalak | G06F 13/1668 |
| | | | 711/154 |
| 2009/0157949 A1* | 6/2009 | Leibowitz | G11C 29/72 |
| | | | 711/E12.008 |
| 2017/0300419 A1 | 10/2017 | Yang | |
| 2022/0197533 A1* | 6/2022 | Marosan | G06F 13/404 |

OTHER PUBLICATIONS

Yang, Xi, et al. "Why nothing matters: The impact of zeroing." Acm Sigplan Notices 46.10 (2011): 307-324. (Year: 2011).*
"The Authoritative Dictionary of IEEE Standards Terms, Seventh Edition," in IEEE Std 100-2000 , vol. No. pp. 573, Dec. 11, 2000. (Year: 2000).*
OA letter of a counterpart TW application (appl. No. 110139143) mailed on Jul. 14, 2022. Summary of the TW OA letter: Claim(s) 1-10 is/are rejected under Patent Law Article 22(2) as being unpatentable over reference 1 (US 2017/0300419 A1) and reference 2 (US 2006/0129767 A1). Claim correspondence between the TW counterpart application and the instant US application: Claims 1-10 in the TW counterpart application correspond to claims 1-9 and 17 in the instant US application, respectively.

* cited by examiner

GENERATING COMMANDS FOR A MEMORY CONTROLLER TO WRITE A TARGET VALUE

BACKGROUND OF THE INVENTION

1. Field of the Invention

The present invention generally relates to electronic devices, and, more particularly, to electronic devices that access a memory and a data writing method.

2. Description of Related Art

The memset function in C language (please refer to github.com/gcc-mirror/gcc/blob/master/libgcc/memset.c) is the function that the central processing unit (CPU) employs to perform a universal setting on a certain memory block, for example, clearing a block of memory (e.g., writing a value of 0 to the whole block of memory).

The usual CPU uses the following method to implement the memset function: storing a fixed value to a memory address, and repeating the process until the required set number is reached. This method consumes a lot of working time of the CPU to complete the data transfer. Even though the writing process writes the same data, to complete the process, the CPU still needs to repeatedly execute multiple codes, which takes up a lot of memory or program space. In cases where burst write is not implemented or the burst write length of the CPU is limited, the system consumes more time.

In C language, functions similar to the memset function include the strset function and the strnset function. In addition, corresponding functions can be seen in other languages (e.g., Python, TCL, etc.), and the same problems occur when such functions are being executed by the CPU or system.

SUMMARY OF THE INVENTION

In view of the issues of the prior art, an object of the present invention is to provide electronic devices and data writing methods, so as to make an improvement to the prior art.

According to one aspect of the present invention, an electronic device that accesses a memory is provided. The electronic device includes a processing circuit, a bus, and a memory controller. The processing circuit includes a bus interface control circuit. The processing circuit generates a first write command through the bus interface control circuit according to a memory access command that contains a first memory address and a target value. The first write command contains the first memory address and the target value. The bus is coupled to the bus interface control circuit and configured to generate a second write command according to the first write command. The second write command contains a second memory address and the target value. The memory controller is coupled to the bus and configured to write the target value to the memory according to the second memory address.

According to another aspect of the present invention, a method of writing data to a memory is provided. The method includes the following steps: generating a first write command through a bus interface control circuit according to a memory access command that contains a first memory address and a target value, the first write command containing the first memory address and the target value; generating a second write command according to the first write command, the second write command containing a second memory address and the target value; and writing the target value to the memory according to the second memory address.

According to still another aspect of the present invention, an electronic device that accesses a memory is provided. The electronic device includes a processing circuit, a bus, and a memory controller. The processing circuit includes a computing circuit and a bus interface control circuit. The computing circuit generates a first write command through the bus interface control circuit according to a memory access command that contains a first memory address and a target value. The first write command contains a second memory address and the target value. The bus is coupled to the bus interface control circuit and configured to generate a second write command according to the first write command. The second write command contains the second memory address and the target value. The memory controller is coupled to the bus and configured to write the target value to the memory according to the second memory address.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes electronic devices that access a memory and methods of writing data to a memory. On account of that some or all elements of the electronic devices could be known, the detail of such elements is omitted provided that such detail has little to do with the features of this disclosure, and that this omission nowhere dissatisfies the specification and enablement requirements. Some or all of the processes of the data writing methods may be implemented by software and/or firmware, and can be performed by the electronic devices or their equivalent. A person having ordinary skill in the art can choose components or steps equivalent to those described in this specification to carry out the present invention, which means that the scope of this invention is not limited to the embodiments in the specification.

Figure 1:
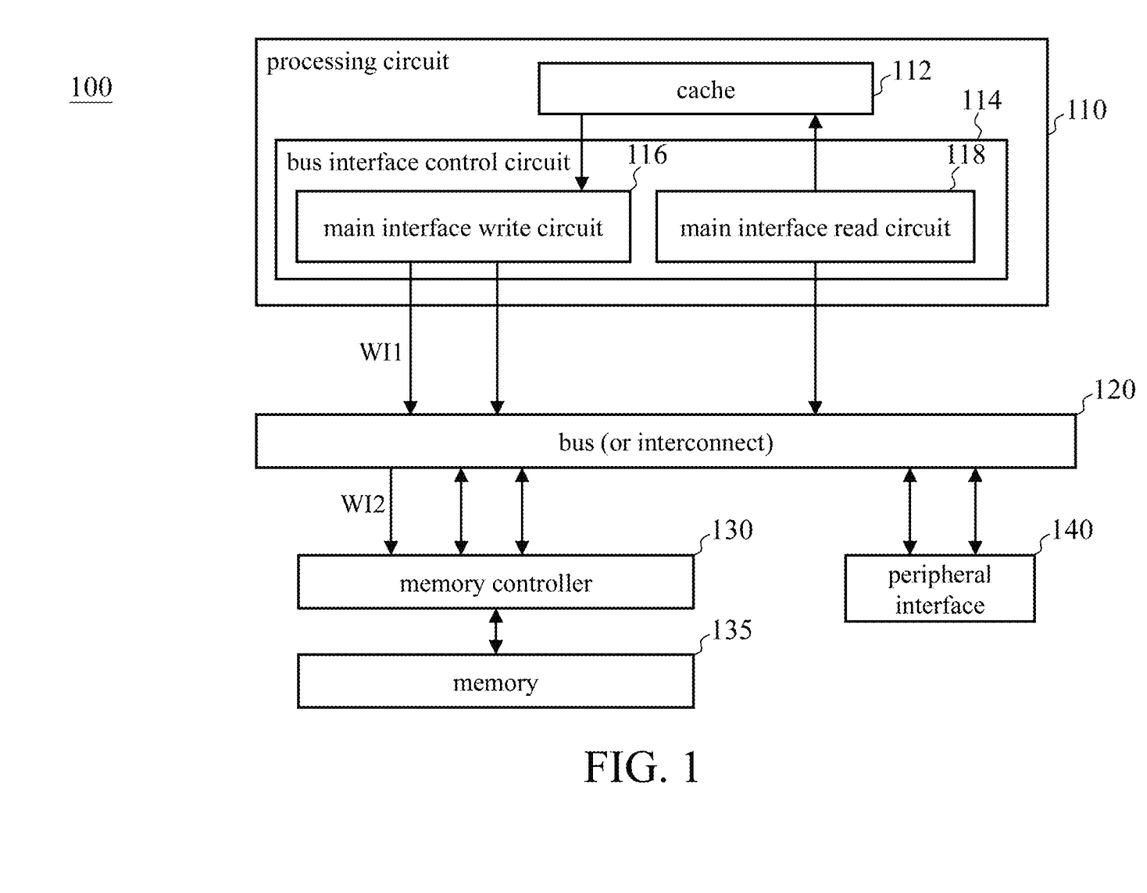
FIG. 1 is a functional block diagram of an electronic device according to an embodiment of the present invention.

FIG. 1 is a functional block diagram of an electronic device according to an embodiment of the present invention. The electronic device 100 includes a processing circuit 110, a bus (or interconnect) 120, a memory controller 130, a memory 135, and a peripheral interface 140. The processing circuit 110 includes a cache 112 and a bus interface control circuit 114. The bus interface control circuit 114 includes a main interface write circuit 116 and a main interface read circuit 118.

Figure 2:
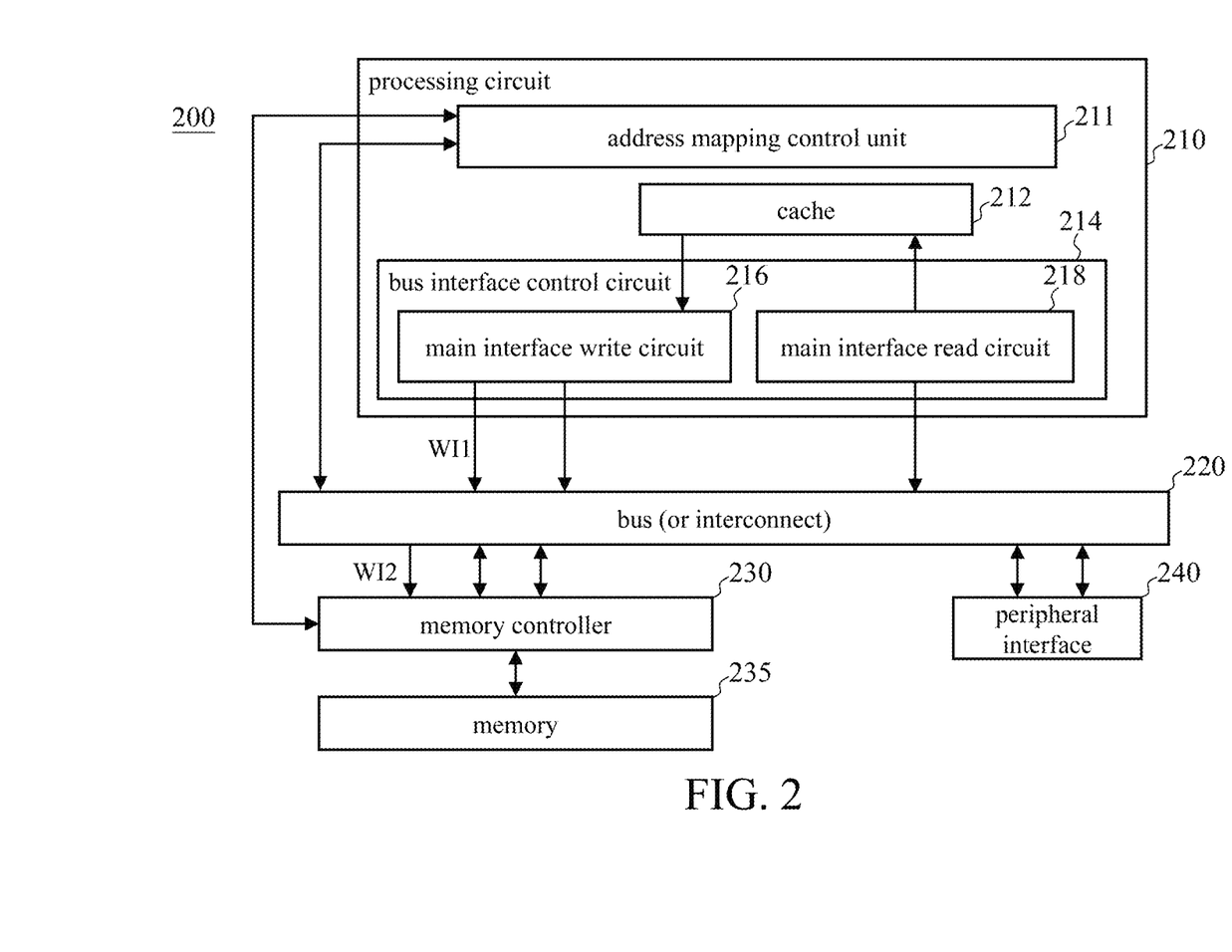
FIG. 2 is a functional block diagram of an electronic device according to another embodiment of the present invention.

FIG. 2 is a functional block diagram of an electronic device according to another embodiment of the present invention. The electronic device 200 includes a processing circuit 210, a bus (or interconnect) 220, a memory controller 230, a memory 235, and a peripheral interface 240. The processing circuit 210 includes an address mapping control unit 211, a cache 212, and a bus interface control circuit 214. The bus interface control circuit 214 includes a main interface write circuit 216 and a main interface read circuit 218.

The processing circuit 110 and the processing circuit 210 may be circuits or electronic components with program execution capabilities, such as central processing units, microprocessors, micro-processing units, digital signal processors, application specific integrated circuit (ASIC), or equivalents thereof.

The processing circuit 110 (or 210) controls or operates the bus 120 (or 220) through the bus interface control circuit 114 (or 214). The main interface write circuit 116 (or 216) is mainly used to perform a write operation on the slave device (e.g., memory), and the main interface read circuit 118 (or 218) is mainly used to perform a read operation on the slave device. The peripheral interface 140 (or 240) can be a Universal Serial Bus (USB) or a universal asynchronous receiver/transmitter (UART).

The address mapping control unit 211 stores the mapping between the physical address and the virtual address of the memory and can be accessed by the processing circuit 210, the bus 220, and the memory controller 230.

Figure 3:
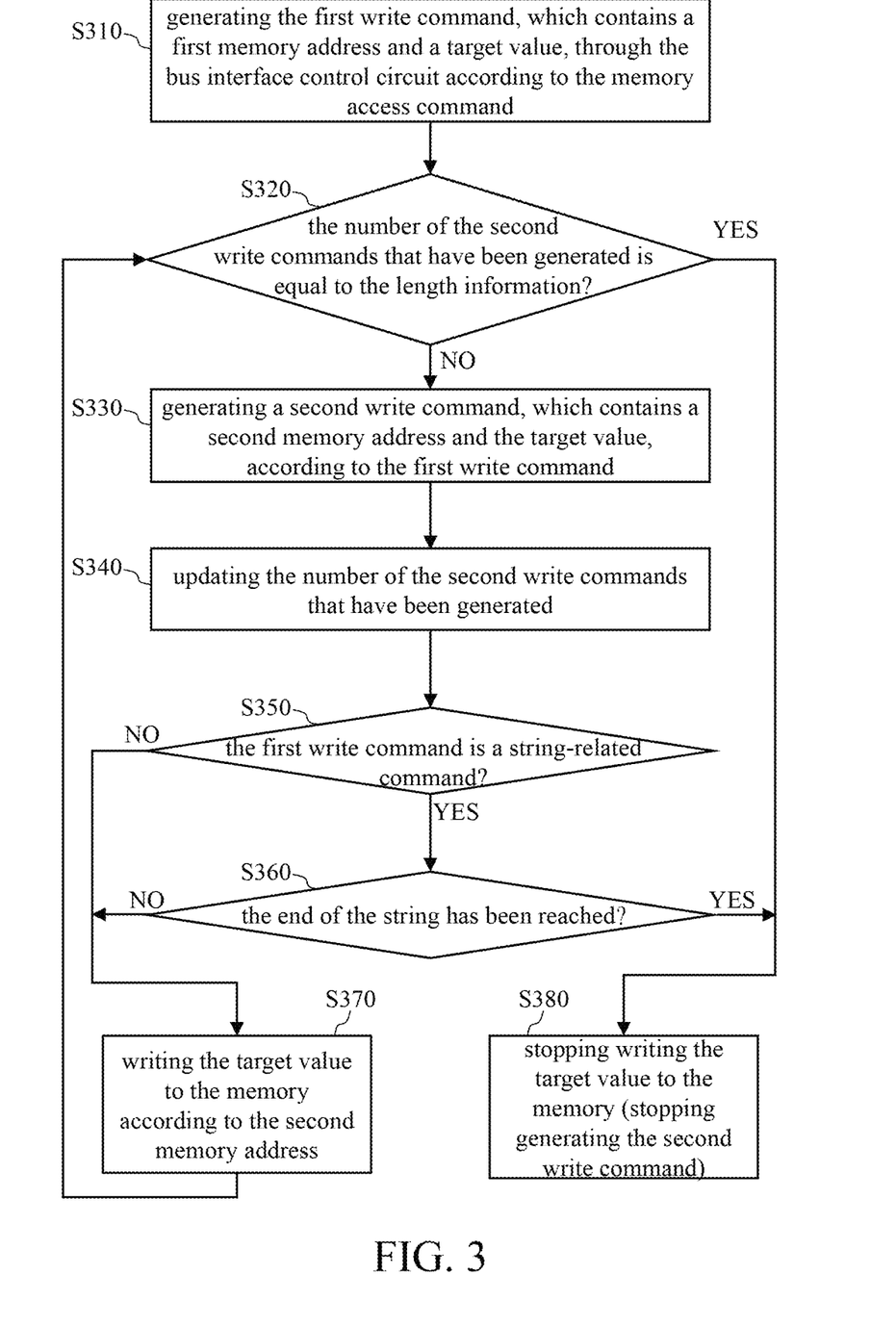
FIG. 3 is a flowchart of a data writing method according to an embodiment of the present invention.

FIG. 3 is a flowchart of a data writing method according to an embodiment of the present invention. Please refer to FIGS. 1-3 for the following discussions.

Step S310: The processing circuit 110 (or 210) generates the first write command WI1 through the bus interface control circuit 114 (or 214) according to the memory access command (e.g., according to the register content that has already been written to the register, that is, the machine code compiled by the compiler). The first write command WI1 contains a first memory address and a target value. Taking the architecture of RISC-V ("RISC" stands for reduced instruction set computer) as an example, the memory access command is, for example, "MEMSET rd, rs1, rs2," an example format of which is as follows:

| Field Name and Width | imm 7 bits | rs2 5 bits | rs1 5 bits | opt 3 bits | rd 5 bits | OP code 7 bits |
|---|---|---|---|---|---|---|
| Value | | | | | | 0111111 | where "rd" indicates the destination address of the MEMSET operation, "rs1" indicates the number of MEMSET operations (or referred to as the length information), "rs2" indicates the fixed value of the MEMSET operation, "imm" is used to support different data types or width definitions (the default value is "0", "0" for 1 byte wide, "1" for 2 bytes wide, "2" for 4 bytes wide, "8" for 8 bytes wide, "9" for 16 bytes wide, and so on), "opt" is an optional field (which may or may not have a value), and "OP code" indicates an operation code (in this example, "OP code"=0x3f indicates that the memory access command is an extended command of the processing circuit 110 (or 210)).

When the processing circuit 110 (or 210) executes the memory access command, the processing circuit 110 (or 210) converts the information contained in the memory access command into a command on the bus 120 (or 220). Specifically, the processing circuit 110 (or 210) generates the first write command WI1 (i.e., the command on the bus 120 (or 220)) through the bus interface control circuit 114 according to the memory access command, and the first write command WI1 contains a first memory address (i.e., the value of "rd"), length information (i.e., the value of "rs1"), and a target value (i.e., the value of "rs2").

Taking the bus 120 (or 220) being an Advanced eXtensible Interface (AXI) for example, when the processing circuit 110 (or 210) executes the memory access command, the first write command WI1 that the processing circuit 110 (or 210) generates through the bus interface control circuit 114 (or 214) contains awaddr (the destination address, namely, the value of "rd"), awlen (the burst length, namely, the value of "rs1"), awsize (the value of "imm"), awvalid (which is 1), wdata (the target value, namely, the value of "rs2"), wstrb (the mask bit of each byte), and ID. The wdata, wstrb, and ID belong to the information of WChannel of AXI. In some embodiments, the bus interface control circuit 114 (or 214) may assign a special value (e.g., 1) to the user extension signal (e.g., awuser [0]) of the AXI command, indicating that the first write command WI1 is a command relating to the memset function. For details about AXI, please refer to: en.wikipedia.org/wiki/Advanced_eXtensible_Interface.

Step S320: The bus 120 (or 220) determines whether the number N_WI2 of the second write commands WI2 that have been generated is equal to the length information. More specifically, after receiving the first write command WI1, the bus 120 (or 220) first stores the length information (i.e., the value of "rs1"). The result of step S320 being YES means that the bus 120 (or 220) has finished executing the first write command WI1 (i.e., having finished the equivalent operation of the memset function, the strset function, or the strnset function); the result of step S320 being NO means that the bus 120 (or 220) has not finished executing the first write command WI1. The second write command WI2 will be discussed in detail below.

Step S330: The bus 120 (or 220) generates a second write command WI2 according to the first write command WI1. The second write command WI2 contains a second memory address and the target value. The details of step S330 will be discussed below in connection with FIG. 4. After the second write command WI2 is generated, the bus 120 (or 220) transmits the second write command WI2 to the memory controller 130 (or 230).

Step S340: The bus 120 (or 220) updates the number N_WI2 of the second write commands WI2 that have been generated, for example, incrementing N_WI2 by 1.

Step S350: The bus 120 (or 220) determines whether the first write command WI1 is a string-related command. If the first write command WI1 is a string-related command (e.g., corresponding to the strset function or the strnset function), the result of step S350 is YES (proceeding to step S360); otherwise, the result is NO (proceeding to step S370).

Step S360: The bus 120 (or 220) determines whether the end of the string has been reached. If the bus 120 (or 220) has reached the end of the string (i.e., the processing of the string has been completed), the result of step S360 is YES (proceeding to step S380); otherwise the result is NO (proceeding to step S370).

Step S370: The memory controller 130 (or 230) writes the target value to the memory 135 (or 235) according to the second memory address. In some embodiments, the memory controller 130 (or 230) writes the target value to the second memory address. After step S370 finishes, the flow returns to step S320.

Step S380: The bus 120 (or 220) stops writing the target value to the memory 135 (or 235) (i.e., stops generating the second write command WI2). That is, the bus 120 (or 220) has completed the equivalent operation of the memset function, the strset function, or the strnset function.

In the flow of FIG. 3, if the length information (i.e., the value of "rs1") is greater than the maximum burst length acceptable to the memory controller 130 (or 230), the bus 120 (220) transmits one second write command WI2 in multiple times, and the source, destination address, and quantity of the current transmission are recorded for the next transmission of the remaining of same second write command WI2.

Figure 4:
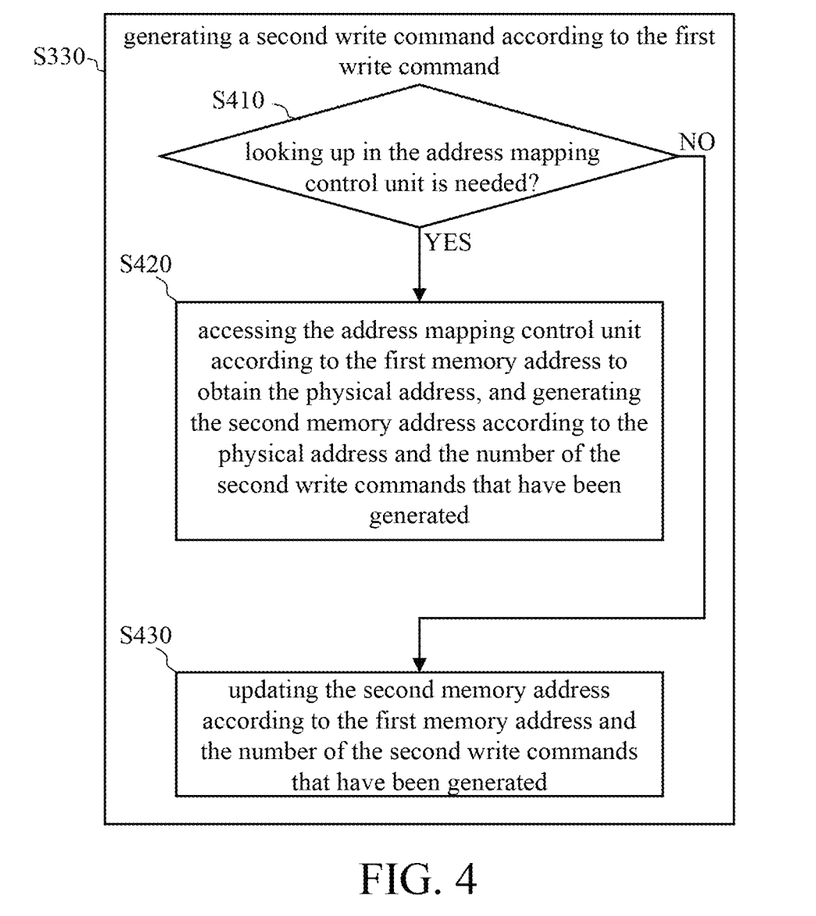
FIG. 4 is the detailed flowchart of step S330.

Reference is made to FIG. 4 which is a detailed flowchart of step S330 that includes the following sub-steps.

Step S410: the bus 120 (or 220) determines whether looking up in the address mapping control unit 211 is needed. When the result of step S410 is NO, the bus 120 performs step S430; when the result of step S410 is YES, the bus 220 performs step S420. Because the embodiment of FIG. 1 does not include an address mapping control unit, there is no need for the bus 120 to look up in the address mapping control unit. In the embodiment of FIG. 2, whenever the address that the bus 220 processes (i.e., the first memory address) exceeds a preset address range (e.g., 4 KB) of the address mapping control unit 211, the bus 220 needs to request the address mapping control unit 211 for address translation to obtain a destination address (i.e., to translate a virtual address into a physical address).

Step S420: The bus 220 accesses the address mapping control unit 211 according to the first memory address to obtain the physical address, and generates the second memory address according to the physical address and the number N_WI2 of the second write commands WI2 that have been generated. More specifically, the first memory address is a virtual address, and the address mapping control unit 211 records the physical address corresponding to the first memory address. After obtaining the physical address, the bus 220 offsets the physical address by the number N_WI2 to generate the second memory address. The second write command WI2 contains the second memory address and the target value.

Step S430: The bus 120 updates the second memory address according to the first memory address and the number of the second write commands WI2 that have been generated. More specifically, the first memory address is a physical address, and the address obtained by offsetting the first memory address by the number N_WI2 is the current physical address (i.e., the second memory address). The second write command WI2 contains the second memory address and the target value.

Figure 5:
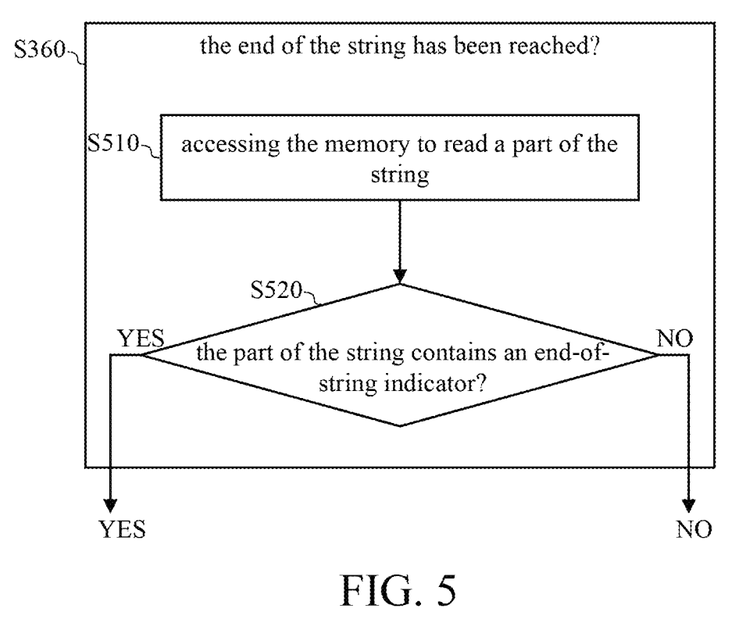
FIG. 5 is the detailed flowchart of step S360.

Reference is made to FIG. 5 which is a detailed flowchart of step S360 that includes the following sub-steps.

Step S510: The bus 120 (or 220) controls the memory controller 130 (or 230) to access the memory 135 (or 235) to read a part of the string (e.g., the end of the string).

Step S520: The bus 120 (or 220) determines whether the part of the string contains an end-of-string indicator (e.g., "0"). If the result of step S520 is YES, the result of step S360 is YES; otherwise, the result of S360 is NO.

Figure 6:
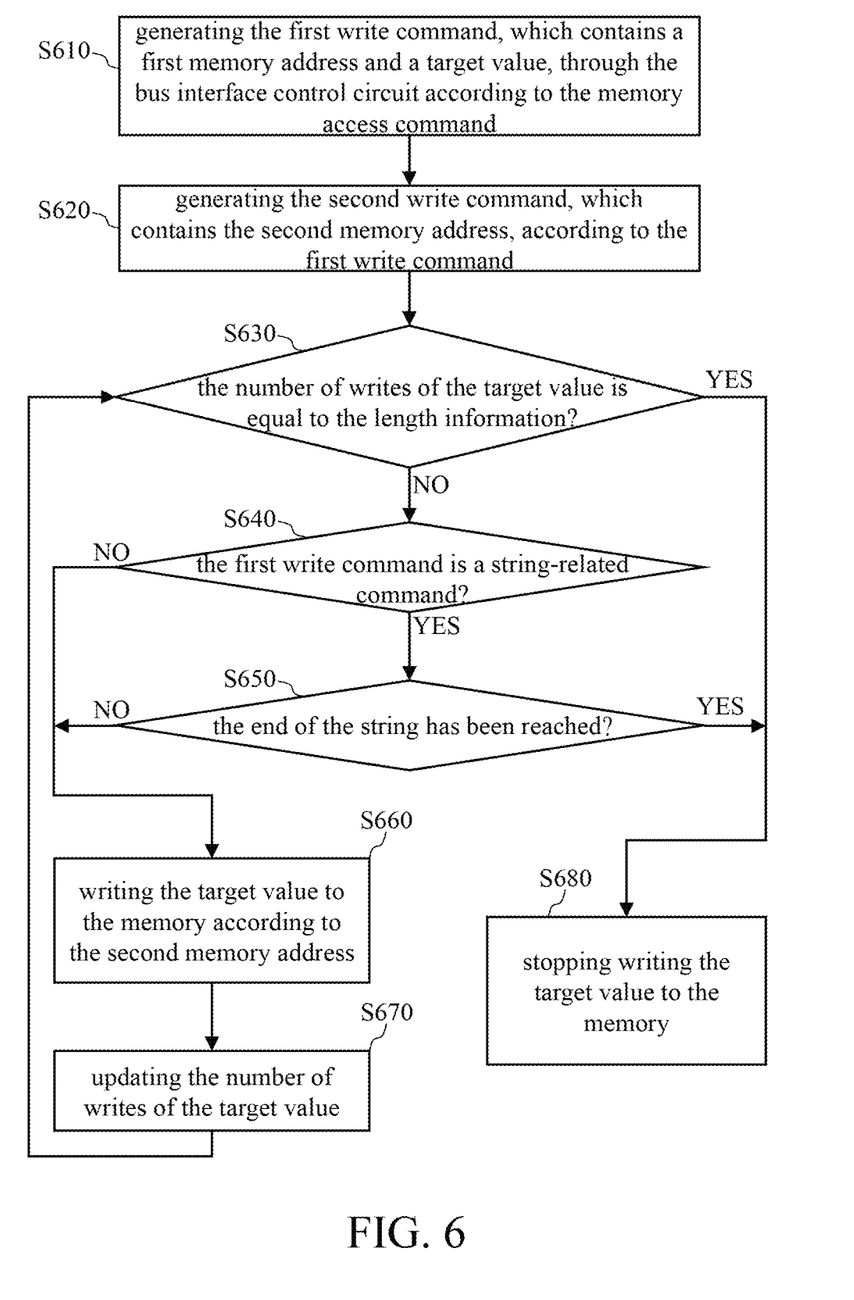
FIG. 6 is a flowchart of a data writing method according to another embodiment of the present invention.

FIG. 6 is a flowchart of a data writing method according to another embodiment of the present invention. Reference is made to FIGS. 1-2 and FIG. 6 for the discussions below. The operational details of steps S610, S640 and S650 are similar to or the same as those of steps S310, S350 and S360, respectively, and the details are thus omitted herein for brevity.

Step S620: The bus 120 (or 220) generates the second write command WI2 according to the first write command WI1. The second write command WI2 contains the second memory address, the target value, and length information. In some embodiments, the second write command WI2 may be identical to the first write command WI1 (in other words, the second memory address is identical to the first memory address). After the second write command WI2 is generated, the bus 120 (or 220) transmits the second write command WI2 to the memory controller 130 (or 230).

Step S630: The memory controller 130 (or 230) determines whether the number of writes N_TR of the target value is equal to the length information. More specifically, after receiving the second write command WI2, the memory controller 130 (or 230) first stores the length information (i.e., the value of "rs1"). The result of step S630 being YES means that the memory controller 130 (or 230) has finished executing the second write command WI2 (i.e., having finished the equivalent operation of the memset function, the strset function, or the strnset function); the result of step S630 being NO means that the memory controller 130 (or 230) has not finished executing the second write command WI2.

Step S660: The memory controller 130 (or 230) writes the target value to the memory 135 (or 235) according to the second memory address. The details of step S660 will be discussed below in connection with FIG. 7.

Step S670: The memory controller 130 (or 230) updates the number of writes N_TR of the target value, for example, incrementing N_TR by 1.

Step S680: The memory controller 130 (or 230) stops writing the target value to the memory 135 (or 235). That is, the memory controller 130 (or 230) has completed the equivalent operation of the memset function, the strset function, or the strnset function.

Figure 7:
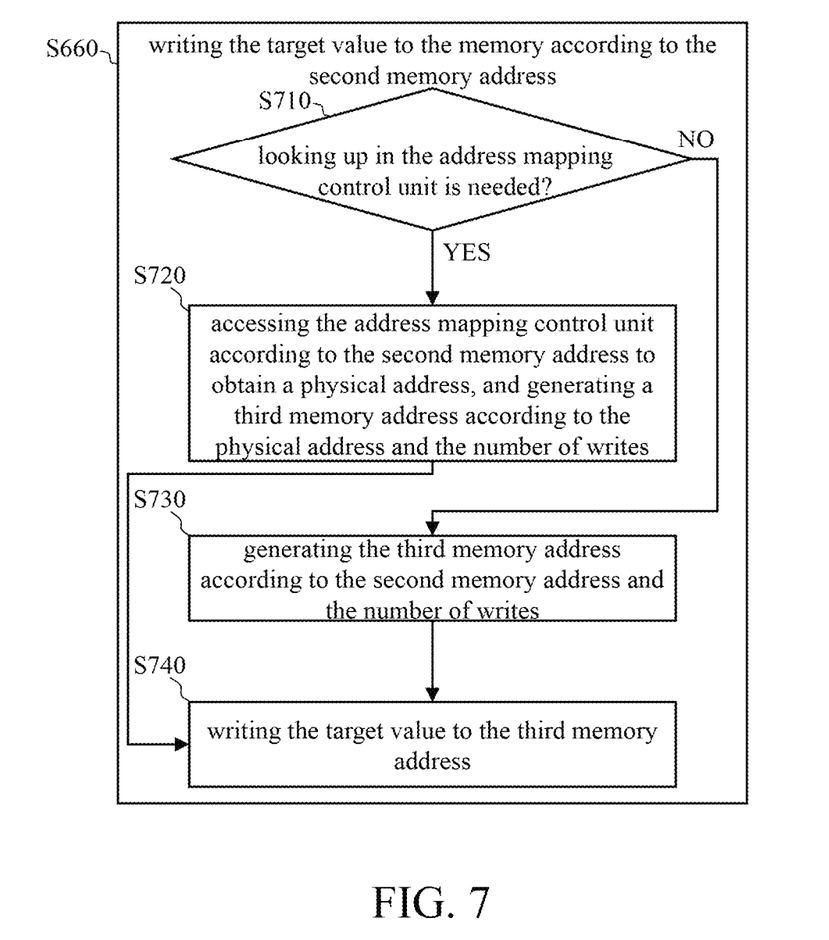
FIG. 7 is the detailed flowchart of step S660.

Reference is made to FIG. 7 which is a detailed flowchart of step S660 that includes the following sub-steps.

Step SS10: The memory controller 130 (or 230) determines whether looking up in the address mapping control unit 211 is needed. When the result of step S710 is NO, the memory controller 130 performs steps S730 and S740; when the result of step S710 is YES, the memory controller 230 performs steps S720 and S740.

Step S720: The memory controller 230 accesses the address mapping control unit 211 according to the second memory address to obtain a physical address, and generates a third memory address according to the physical address and the number of writes N_TR. More specifically, the second memory address is a virtual address, and the address mapping control unit 211 records the physical address corresponding to the second memory address. After obtaining the physical address, the memory controller 230 offsets the physical address by the number of writes N_TR to generate the third memory address.

Step S730: The memory controller 130 generates the third memory address according to the second memory address and the number of writes N_TR. More specifically, the second memory address is a physical address, and the address obtained by offsetting the second memory address by the number of writes N_TR is the current physical address (i.e., the third memory address).

Step S740: The memory controller 130 (or 230) writes the target value to the third memory address of the memory 135 (or 235).

In the embodiment discussed above, the response timing of the bus 120 (or 220) or the memory controller 130 (or 230) is as follows: (1) reply to the processing circuit 110 (or 210) immediately after receiving the first write command WI1 (or the second write command WI2); or (2) not reply until all write operations are completed. The way of replying includes (but is not limited to) sending a response and/or sending an interrupt.

To sum up, using a bus or a memory controller to implement the operations related to continuous writing of the memory (including but not limited to the memset function, strset function, and strnset function in C language) has the following advantages: (1) fewer commands that the processing circuit needs to process; (2) shorter execution time of the processing circuit; and (3) avoiding the long-time occupation of the bandwidth between the processing circuit and the bus (i.e., the embodiment of FIG. 3) or the bandwidth between the processing circuit and the memory controller (i.e., the embodiment of FIG. 6). That is to say, by extending the commands of the processing circuit and extending the communication protocol, the present invention provides an apparatus and method of implementing, in the bus or the memory controller, the acceleration of the continuous writing of the memory. The present invention reduces the time of occupying the processing circuit, improves the code efficiency, reduces the number of codes (i.e., occupies less program space), and greatly reduces transactions between the processing circuit and the bus (i.e., allows the processing circuit to transmit more data through the bus).

Figure 8:
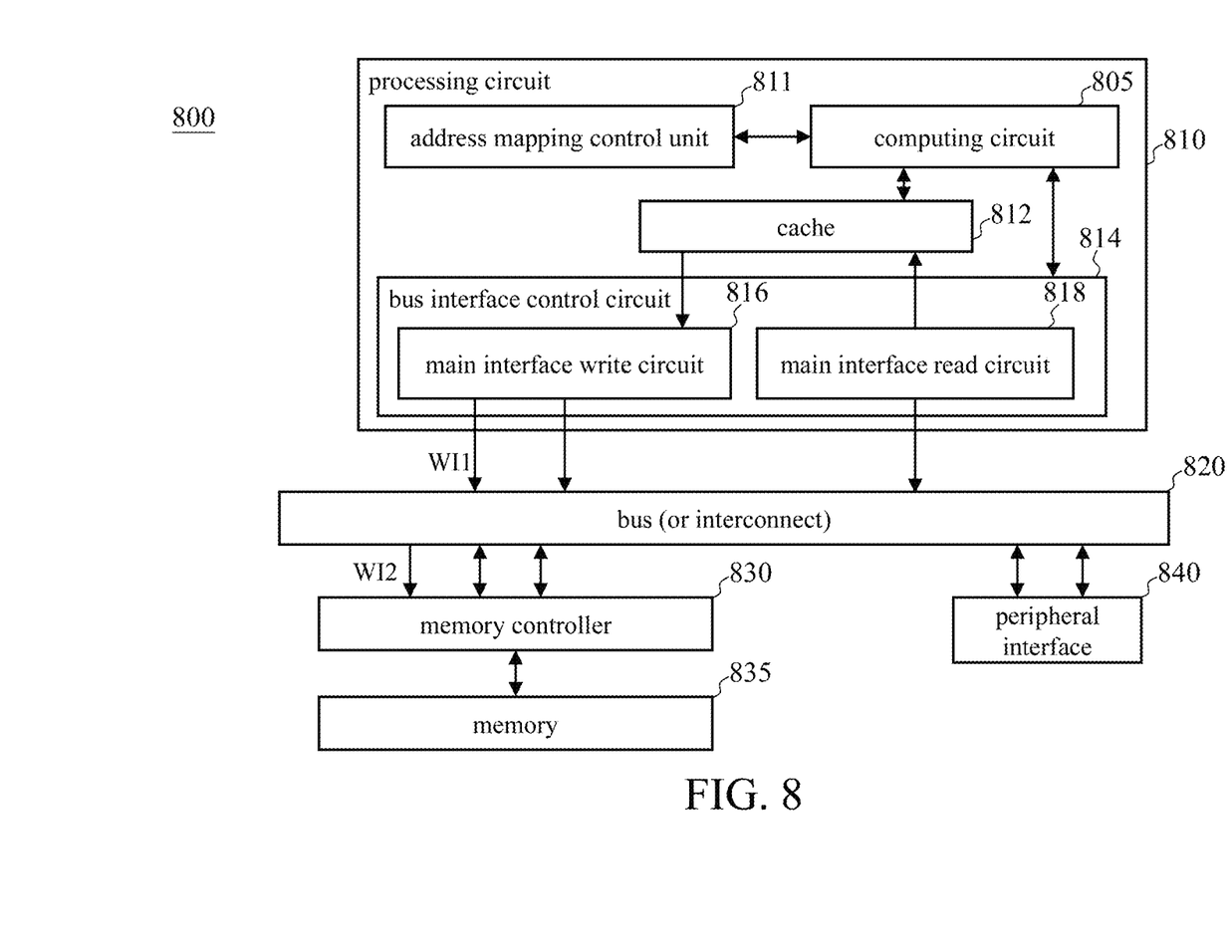
FIG. 8 is a functional block diagram of an electronic device according to another embodiment of the present invention.

FIG. 8 is a functional block diagram of an electronic device according to another embodiment of the present invention. The electronic device 800 includes a processing circuit 810, a bus (or interconnect) 820, a memory controller 830, a memory 835, and a peripheral interface 840. The processing circuit 810 includes a computing circuit 805, an address mapping control unit 811, a cache 812, and a bus interface control circuit 814. The bus interface control circuit 814 includes a main interface write circuit 816 and a main interface read circuit 818. The computing circuit 805 may be an engine of the processing circuit 810, or a co-processor. The functions of the address mapping control unit 811, the cache 812, the bus interface control circuit 814, the main interface write circuit 816, and the main interface read circuit 818 are respectively the same as or similar to those of the address mapping control unit 211, the cache 212, the bus interface control circuit 214, the main interface write circuit 216, and the main interface read circuit 218; the details are thus omitted for brevity.

Figure 9:
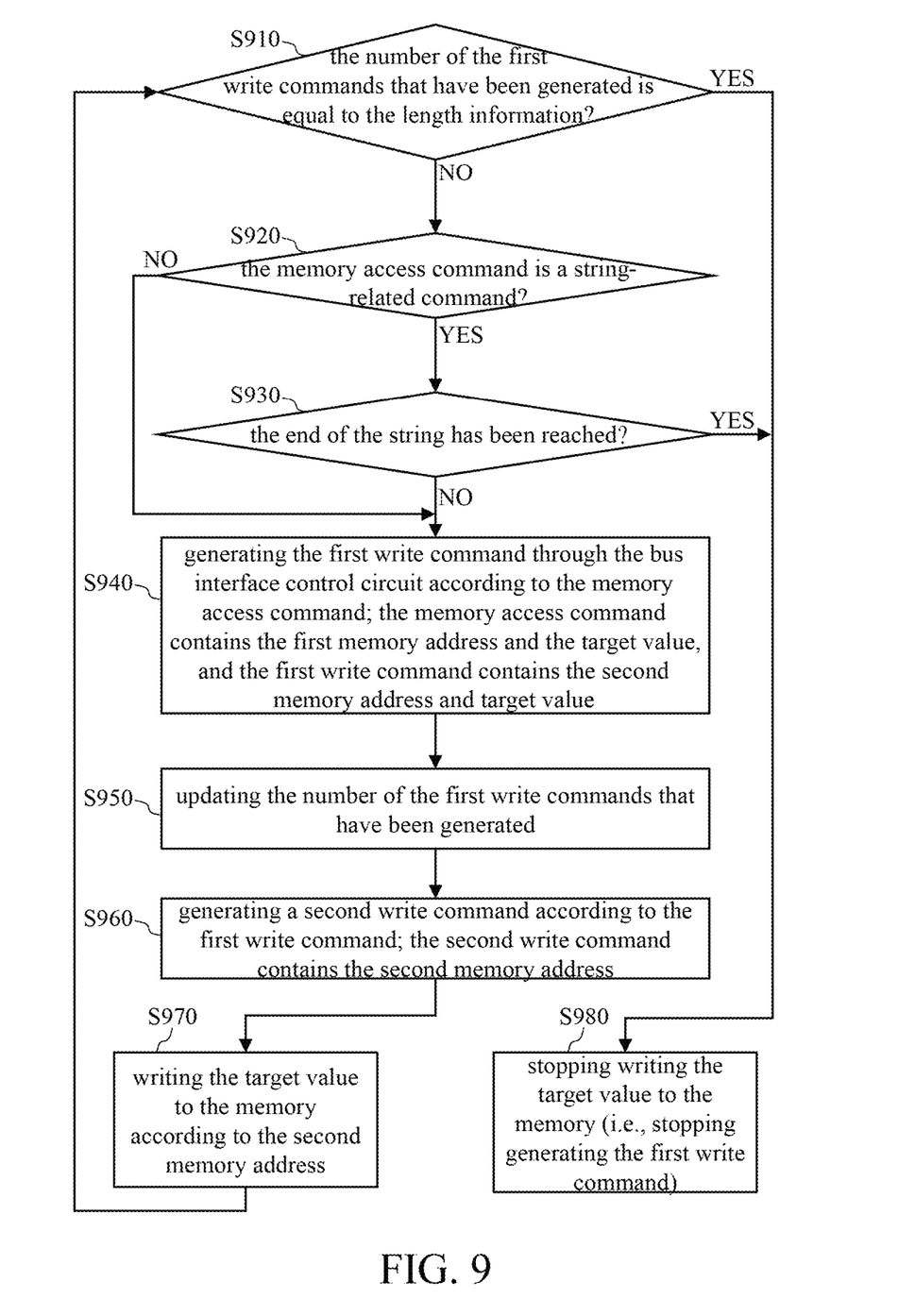
FIG. 9 is a flowchart of a data writing method according to another embodiment of the present invention.
Figure 10:
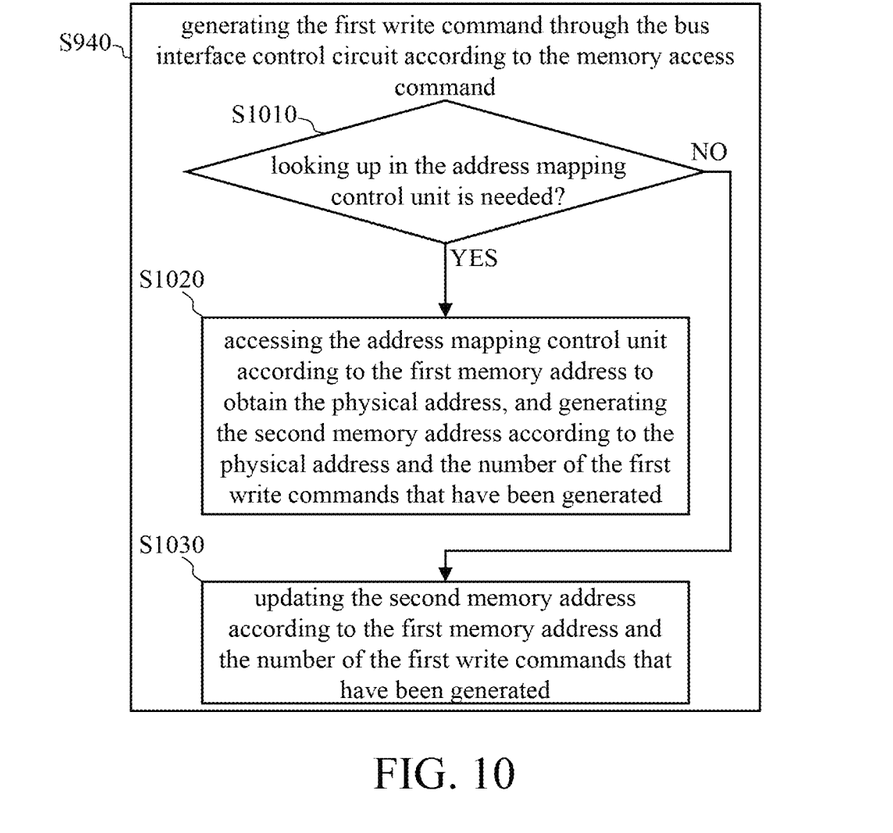
FIG. 10 is a detailed flowchart of step S940.

FIG. 9 is a flowchart of a data writing method according to another embodiment of the present invention, and FIG. 10 shows a detailed flowchart of step S940. Reference is made to FIGS. 8-10 for the discussions below.

Step S910: The computing circuit 805 determines whether the number N_WI1 of the first write commands WI1 that have been generated is equal to the length information. Step S910 is similar to step S320, please refer to the discussions of step S320.

Step S920: The computing circuit 805 determines whether the memory access command is a string-related command. Step S920 is similar to step S350, please refer to the discussions of step S350.

Step S930: The computing circuit 805 determines whether the end of the string has been reached. Step S930 is similar to step S360, please refer to the discussions of step S360 and FIG. 5.

Step S940: The computing circuit 805 generates the first write command WI1 through the bus interface control circuit 814 according to the memory access command; the memory access command contains the first memory address and the target value, and the first write command contains the second memory address and target value. The details of step S940 will be discussed in detail in FIG. 10.

Step S950: The computing circuit 805 updates the number N_WI1 of the first write commands WI1 that have been generated, for example, incrementing N_WI1 by 1.

Step S960: The bus 820 generates a second write command WI2 according to the first write command WI1; the second write command WI2 contains the second memory address. In some embodiments, the bus 820 may not process the first write command WI1 but directly transmit the first write command WI1 to the memory controller 830; in other words, the second write command WI2 is identical to the first write command WI1.

Step S970: The memory controller 830 writes the target value to the memory 835 according to the second memory address. Step S970 is similar to step S370, please refer to the discussions of step S370.

Step S980: The computing circuit 805 stops writing the target value to the memory 835 (i.e., stops generating the first write command WI1). Step S980 is similar to step S380, please refer to the discussions of step S380.

Step S1010: The computing circuit 805 determines whether looking up in the address mapping control unit 811 is needed. When the result of step S1010 is NO, the computing circuit 805 performs step S1030; when the result of step S1010 is YES, the computing circuit 805 performs step S1020. Step S1010 is similar to step S410, please refer to the discussions of step S410.

Step S1020: The computing circuit 805 accesses the address mapping control unit 811 according to the first memory address to obtain the physical address, and generates the second memory address according to the physical address and the number N_WI1 of the first write commands that have been generated. Step S1020 is similar to step S420, please refer to the discussions of step S420.

Step S1030: The computing circuit 805 updates the second memory address according to the first memory address and the number N_WI1 of the first write commands WI1 that have been generated. Step S1030 is similar to step S430, please refer to the discussions of step S430.

In the embodiments of FIGS. 8-10, the processing circuit 810 uses one engine or co-processor to perform operations related to the memset function, strset function, or strnset function; therefore, other engines or co-processors of the processing circuit 810 can perform other tasks. As a result, the processing circuit 810 is not occupied for a long time.

Although the embodiments discussed above uses C language as an example, this is not a limitation to the present invention. People having ordinary skill in the art can apply the present invention to other types of programming languages (e.g., Python, TCL, etc.) according to the disclosure of the present invention.

Although AXI is used as an example in the embodiments discussed above, this is not a limitation to the present invention. People having ordinary skill in the art can apply the present invention to other types of bus (e.g., Advanced Micro-controller Bus Architecture (AMBA), Advanced Peripheral Bus (APB), or Advanced High-performance Bus (AHB)).

Although the embodiments discussed above take RISC-V as an example, this is not a limitation to the present invention. People having ordinary skill in the art can apply the present invention to other types of architectures (e.g., CISC, MIPS, ARM, RISC, etc.) according to the disclosure of the present invention.

Since a person having ordinary skill in the art can appreciate the implementation detail and the modification thereto of the present method invention through the disclosure of the device invention, repeated and redundant description is thus omitted. The shape, size, and ratio of any element in the disclosed figures are exemplary for understanding, not for limiting the scope of this invention. Furthermore, there is no step sequence limitation for the method inventions as long as the execution of each step is applicable. In some instances, the steps can be performed simultaneously or partially simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A method of writing data to a memory, comprising:
   converting a memory access command into a first write command through a bus interface control circuit, the memory access command containing a first memory address and a target value, the first write command containing the first memory address and the target value;
   generating a second write command according to the first write command, the second write command containing a second memory address and the target value; and
   receiving the second write command by a memory controller wherein the memory controller writes the target value to the memory according to the second memory address;
   wherein the first write command contains length information, the method further comprising:
   continuing generating the second write command until the number of the second write commands is equal to the length information.

2. The method of claim 1, wherein the step of generating the second write command according to the first write command comprises:
   updating the second memory address according to the first memory address and the number of the second write commands.

3. The method of claim 1, wherein the step of generating the second write command according to the first write command comprises:
   accessing an address mapping control unit according to the first memory address to obtain a physical address, and generating the second memory address according to the physical address and the number of the second write commands.

4. The method of claim 1, wherein the first write command contains length information, the method further comprising:
   continuing writing the target value to the memory until the number of writes is equal to the length information.

5. The method of claim 4, wherein the step of writing the target value to the memory according to the second memory address comprises:
   generating a third memory address according to the second memory address and the number of writes; and
   writing the target value to the third memory address.

6. The method of claim 4, wherein the step of writing the target value to the memory according to the second memory address comprises:
   accessing an address mapping control unit according to the second memory address to obtain a physical address;
   generating a third memory address according to the physical address and the number of writes; and
   writing the target value to the third memory address.

7. The method of claim 1, wherein the first write command relates to a string, the method further comprising:
   accessing the memory to read a part of the string; and
   stopping generating the second write command, or stopping writing the target value to the memory when the part of the string contains an end-of-string indicator.

* * * * *